United States Patent
Krupezevic et al.

(10) Patent No.: US 6,803,814 B1
(45) Date of Patent: *Oct. 12, 2004

(54) DEMODULATOR AND METHOD FOR THE DEMODULATION OF MODULATED RF SIGNALS

(75) Inventors: Dragan Krupezevic, Stuttgart (DE); Veselin Brankovic, Fellbach (DE); Gerald Oberschmidt, Fellbach (DE); Masayoshi Abe, Kanagawa (JP); Tino Konschak, Stuttgart (DE); Thomas Dölle, Stuttgart (DE)

(73) Assignee: Sony International (Europe) GmbH, Berlin (DE)

( * ) Notice: Subject to any disclaimer, the term of this patent is extended or adjusted under 35 U.S.C. 154(b) by 0 days.

This patent is subject to a terminal disclaimer.

(21) Appl. No.: 09/502,656

(22) Filed: Feb. 11, 2000

Related U.S. Application Data

(63) Continuation-in-part of application No. 09/367,520, filed as application No. PCT/EP98/08329 on Dec. 18, 1998.

(30) Foreign Application Priority Data

Jun. 16, 1999 (EP) .............................................. 99111681

(51) Int. Cl.[7] .................................................. H03D 3/00
(52) U.S. Cl. ...................................... 329/306; 375/340
(58) Field of Search ................................. 375/316, 341, 375/322, 324, 340; 329/304, 306; 455/313, 323, 325

(56) References Cited

U.S. PATENT DOCUMENTS 4,521,728 A 6/1985 Li
4,958,638 A * 9/1990 Sharpe et al. ............... 600/407
6,337,888 B1 * 1/2002 Huang et al. ............... 375/322

FOREIGN PATENT DOCUMENTS

| EP | 0 805 561 A2 | 11/1997 |
| EP | 0 841 756 A2 | 5/1998 |
| EP | 0 884 836 A1 | 12/1998 |

OTHER PUBLICATIONS

Li et al., "A Six–Port Direct Digital Millimeter Wave Receiver", IEEE MTT–S International Microwave Symposium Digest, vol. 3, pp. 1959–1662, San Diego, CA, May 23–27, 1994.

Li et al., "A New Direct Digital Receiver Performing Coherent PSK Reception", IEEE MTT–S International Microwave Symposium Digest, vol. 3, pp. 1007–1010, Orlando, Fla., May 16, 1995.

* cited by examiner

Primary Examiner—Young T. Tse
Assistant Examiner—David B. Lugo
(74) Attorney, Agent, or Firm—Frommer Lawrence & Haug LLP; William S. Frommer

(57) ABSTRACT

A demodulator for modulated RF signals comprises a passive four port structure (1). The four port structure (1) has a first input (3) for supplying a modulated RF signal to be demodulated. A second input (2) is supplied with a RF signal from a local oscillator (21). Two output terminals are connected to power sensors (4, 5). The RF signal from the local oscillator (21) is supplied to the second input (3) of the four port structure (1) without being RF switched by an RF switch. The demodulator is particularly useful for modulation schemes with a finite number of magnitude states (nQAM modulation).

16 Claims, 9 Drawing Sheets

DEMODULATOR AND METHOD FOR THE DEMODULATION OF MODULATED RF SIGNALS

This is a Continuation-In-Part of application Ser. No. 09/367,520, filed Oct. 27, 1999, which is a 371 of PCT/EP98/08329, filed Dec. 18, 1998.

BACKGROUND OF THE INVENTION (1) Field of the Invention

The present invention relates generally on demodulators for modulated RF signals, mobile communications devices comprising such a demodulator as well as the method for demodulating modulated RF signals on the basis of a four port structure. It is particularly suitable for the demodulation of signals having a finite number of different magnitude states, such as f.e. (n)QAM.

(2) Description of Related Art six-port receiver is known acting in the direct conversion manner and allowing conversion from mm-wave range and microwave range directly to the base band. At the same time a classic I/Q-demodulation chip (digital or analogue) can be avoided. By using suitable calibration procedures the influences of the non-ideal passive RF-components including manufacturing tolerances can be minimised. The six-port receiver detects the relative phase and relative magnitude of two incoming RF-signals. The circuitry of the six-port receiver is realised using only passive components in combination with power sensors for the detection of the relative phase and the relative magnitude of the RF-signals. An important feature of six-port receivers is that fabrication tolerances can be calibrated, which inherently allows low-cost production.

In Bossisio, Wu "A six-port direct digital millimeter wave receiver", Digest of 1994 IEEE MTT Symposium, vol. 3, page 1659–1662, San Diego, May 1994, a structure for a six-port receiver is proposed.

The six-port technique has been known for its ability to accurately measure the scattering parameters, both amplitude and phase, of microwave networks. Instead of using heterodyne receivers a six-port receiver accomplishes direct measurements at microwave and mm-wave frequencies by extracting power levels at at least three and particularly four of the 6 ports. The imperfections of the hardware can be readily eliminated by an appropriate calibration procedure. Six-port junction receivers consist of passive microwave components such as directional couplers and power dividers as well as diode detectors. The circuit can be easily integrated as MHMIC or MMIC. The known receiver performs direct phase/amplitude demodulation at microwave and mm-wave frequencies.

By performing a calibration procedure the hardware imperfections can be readily eliminated. This significantly eases the requirement of the hardware implementation and enables the six-port receiver to operate over a wide band up to mm-wave frequencies.

According to the above cited document of Bossisio et. al. a six-port receiver concept with power dividers and 90 degrees hybrid circuits realized in distributed technology is used. The application of that known structure lies mainly in the frequency bands above 10 GHz, however, it suffers from an insufficient band width of the operation due to the inherently frequency selective nature of the 90 degrees hybrid circuits.

FIG. 11 shows the structure of a six-port receiver known from Bossisio, Wu "A six-port direct digital millimeter wave receiver", Digest of 1994 IEEE MTT Symposium, vol. 3, page 1659–1662, San Diego, May 1994.

The incoming digitally modulated RF-signal is compared with the output of a digital controlled local oscillator 218. Carrier recovery is first performed. The DSP-unit 217 detects-the frequency difference of the signals and then controls the local oscillator 218 to track the incoming signal. Once the carrier is recovered the instantaneous phase of the received signal is detected and decoded so as to recover the original modulated data. The maximum data transmission rate is determined mainly by the sampling rate of the A/D-converters 216 and the processing speed of DSP-unit 217.

From D. Maurin, Y. Xu, B. Huyart, K. Wu, M. Cuhaci, R. Bossisio "CPW Millimeter-Wave Six-Port Reflectometers using MHMIC and MMIC technologies", European Microwave Conference 1994, pp. 911–915, a wide-band topology for reflectometer used is known which is based on a distributing element approach featuring coplanar wave guide applications in the frequency range from 11 to 25 GHz.

From V. Bilik, et al. "A new extremely wideband lumped six-port reflectometer" European Microwave Conference 1991, pp. 1473–1477 and the idea of using Wheatstone Bridges and resistive structures for reflectometer applications is known.

From j:Li, G. Bossisio, K. Wu, "Dual tone Calibration of Six-Port Junction and its application to the six-port direct digital receiver", IEEE Transactions on Microwave Theory and Techniques, vol. 40, January 1996 a six-port reflectometer topology based on four 3 dB hybrid circuits, power dividers and attenuators is known.

From U.S. Pat. No. 5,498,969 an asymmetrical topology for a reflectometer structure featuring matched detectors and one unmatched detector is known.

From U.S. Pat. No. 4,521,728 with the title "Method and six-port network for use in determining complex reflection coefficients of microwave networks" a reflectometer six-port topology is known comprising two different quadrate hybrids, phase shifter, two power dividers and one directional coupler for which the realization by a microstrip line technology is disclosed.

From EP-A-0 805 561 a method for implementing a direct conversion receiver with a six-port junction is known. According to this known technique, modulated transmitted modulation is received by a direct conversion receiver which comprises a six-port junction. The demodulation is carried out analogically.

From EP-A- 0 841 756 a correlator circuit for a six-port receiver is known. In this correlator circuit the received signal is summed up with a local oscillator signal at various phase angles, wherein the phase rotation between the local oscillator and RF signals is carried out separately from the summing of the correlator outputs.

In the following a four-port junction device (N=4) as a first example for the N-port junction technology will be explained with reference to FIG. 4. Such a four-port receiver is known from the post-published application PCT/EP 98/08329 in the name of SONY INTERNATIONAL (EUROPE) GMBH.

FIG. 10 shows the use of said known four-port junction device in a I/Q demodulator or QPSK demodulator. A signal is received by means of an antenna 426 and is then either supplied directly to a bandpass filter 428 or first downconverted optionally in a first stage downconverter 427. The output signal of the bandpass filter 428 is amplified by a gain controlled LNA block 429. The gain of the gain controlled LNA block 429 is controlled by a control unit 430. The amplified output signal of the gain controlled LNA block 429 is fed to the RF input 404 of the four-port junction device 401.

A RF switch 451 is connected to the second RF input port 405 of the four-port junction device 401. Depending on the switching position of the RF switch 451 the RF input port 405 of the four-port junction device 401 is either connected to ground potential by means of a resistor 450 with a resistance value of 50 Ω (impedance matching) or a RF output signal of a local oscillator 420 is fed to the RF input 405 of the four—port junction device 401. The frequency and the phase of the local oscillator 420 is also controlled by the control unit 430. Furthermore, the control unit 430 controls the switching effected by the RF switch 451.

The four-port junction device 401 comprises a first passive three-port structure and a second passive three-port structure. The first and the second passive three-port structure are connected with each other by means of a phase shifter. At a RF input port of the first passive three-port structure a RF signal to be processed is supplied. The first passive three-port structure has an output connected to a power sensor $P_1$.

The second passive three-port structure of the four-port junction device according to the embodiment has a RF input port to which a second RF signal is fed wherein the second RF signal can e.g. originate from a local oscillator. The second passive three-port structure has an output port connected to a second power sensor $P_2$.

SUMMARY OF THE INVENTION

In view of the above cited prior art it is the object of the present invention to propose a technique to demodulate modulated RF signals on the basis of a four port receiver structure with less complexity.

Thereby it is the central idea of the present invention to simplify the structure significantly by adapting it for the targeted application, i.e. the targeted modulation scheme used. To the approach according to the present invention is particularly well adapted for nQAM modulated RF signals.

According to the present invention therefore a demodulator for modulated RF signals comprising a passive four port structure (four port receiver structure) is provided. The passive four port structure has a first input for supplying a modulated RF signal to be demodulated. A second input of the four port structure is supplied with the RF signal from a local oscillator. Two output terminals are respectively connected to a power sensor. Thereby the RF signal from the local oscillator is supplied to the second input of the four port structure without being switched by a RF switch. In comparison to the post-published prior art the structure of the demodulator therefore is simplified by the omission of the RF switch (which is connected between the local oscillator and the second input of the four port structure according to the post-published prior art).

An isolation circuitry can be connected to the first input of the passive four port structure for providing a RF/LO isolation.

The four port structure can comprise two three port structures connected with each other by means of a phase shifter.

The four port structure can be implemented by resistive elements.

The low pass filter can be attached to the output of the power sensors.

The output of the low pass filter can be supplied to RID converter and furthermore to a digital processing unit.

At least one of the output signals of the low pass filter can be supplied to an analog averaging unit averaging a plurality of symbols and the output of the analog averaging unit is supplied to an analog processing unit together with the output of low pass filter.

According to the present invention furthermore a mobile communications device comprising a demodulator as said forth above is proposed.

According to another aspect of the present invention a method for demodulating modulated RF signals is proposed. A modulated RF signal to be demodulated is supplied to a first input of a passive four port (receiver) structure. A RF signal from a local oscillator is supplied to a second input of the passive four port structure. Two outputs of the four port structure are supplied to power sensors. The RF signal from the local oscillator thereby is supplied to the second input of the four port structure without RF switching.

The RF signal from the local oscillator can be directly supplied to the second input of the four port structure. The RF input (first input) of the passive four port structure can be isolated to the LO (second input) of the passive four port structure.

The output of the low pass filter step can be A/D converted and then digitally processed.

At least one of the outputs of the low pass filter step be averaged in an analog manner over a plurality of symbols and the output of the analog averaging step can be analog processed together with the output of the low pass filter step.

BRIEF DESCRIPTION OF THE DRAWINGS

In the following preferred embodiments of the present invention will be explained with reference to the figures of the enclosed drawings.

DETAILED DESCRIPTION OF PREFERRED EMBODIMENTS

Figure 1:
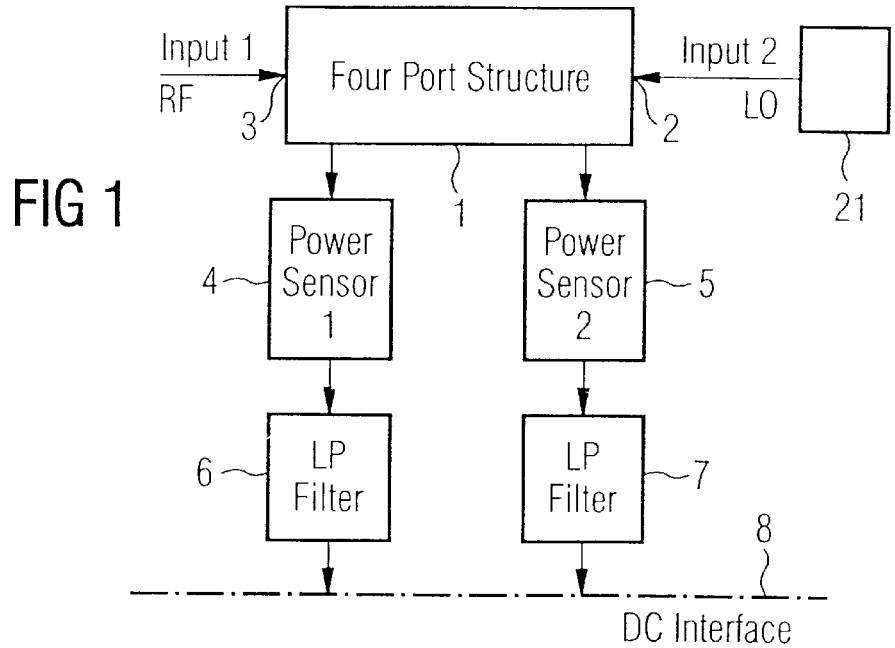
FIG. 1. shows the general concept of a proposed demodulator using a four-port structure according to the present invention, wherein no Rf switch is necessary

FIG. 1 shows the general concept of a demodulator for modulated RF signals on the basis of a four port structure 1. A RF signal to be demodulated is supplied to a first input 3 of the four port structure 1. A second RF signal from a local oscillator 21 is set to a second input 2 of the four port structure 1. Note that in contrast to the pre-post published application PCT/EP 98/08329 the RF signal from the local oscillator 21 is supplied to the second input 2 of the four port structure 1 without any RF switch in between. As shown in FIG. 1 the RF signal from the local oscillator 21 can be set directly to the input 2 of the four port structure 1, however, other circuit elements with the exception of a RF switch can be connected between the local oscillator 21 and the second input 2 of the four port structure 1. The four port structure 1 has to output terminals respectively supplied to a power sensor 4 and a power sensor 5. The output of the power sensors 4, 5 is respectively passed through a low pass filter 6 and 7, respectively, and the filtered output signals are supplied to a DC interface 8 for further processing.

According to a preferred embodiment the RF signal has a prescribed modulation with the finite number of magnitude states. This is the case for example when using nQAM modulation schemes.

Figure 2:
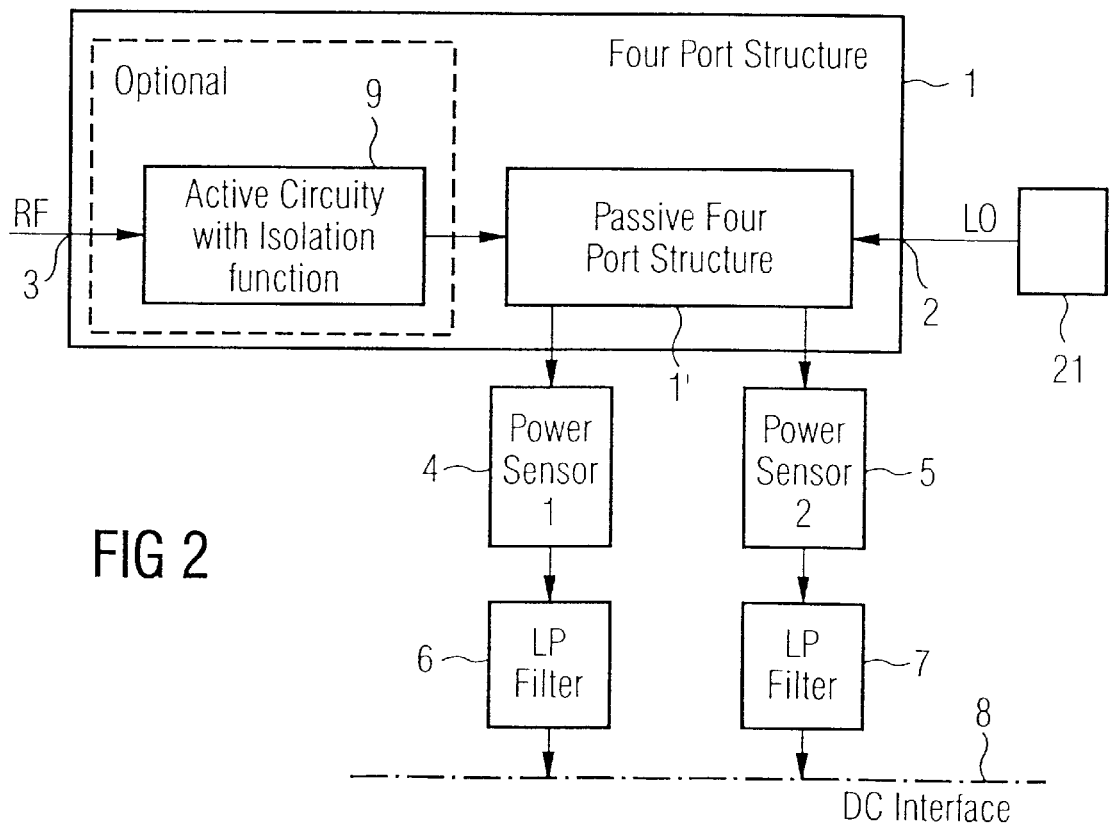
FIG. 2 shows the internal structure of a four port structure according to a preferred embodiment.

As shown in FIG. 2 the RF input 3 can be isolated from the LO input 2 of the four port structure 1. This can be done according to the embodiment of FIG. 2 by connecting an active circuitry 9 with isolation function between the RF input and the actual passive four port structure 1.

Figure 3:
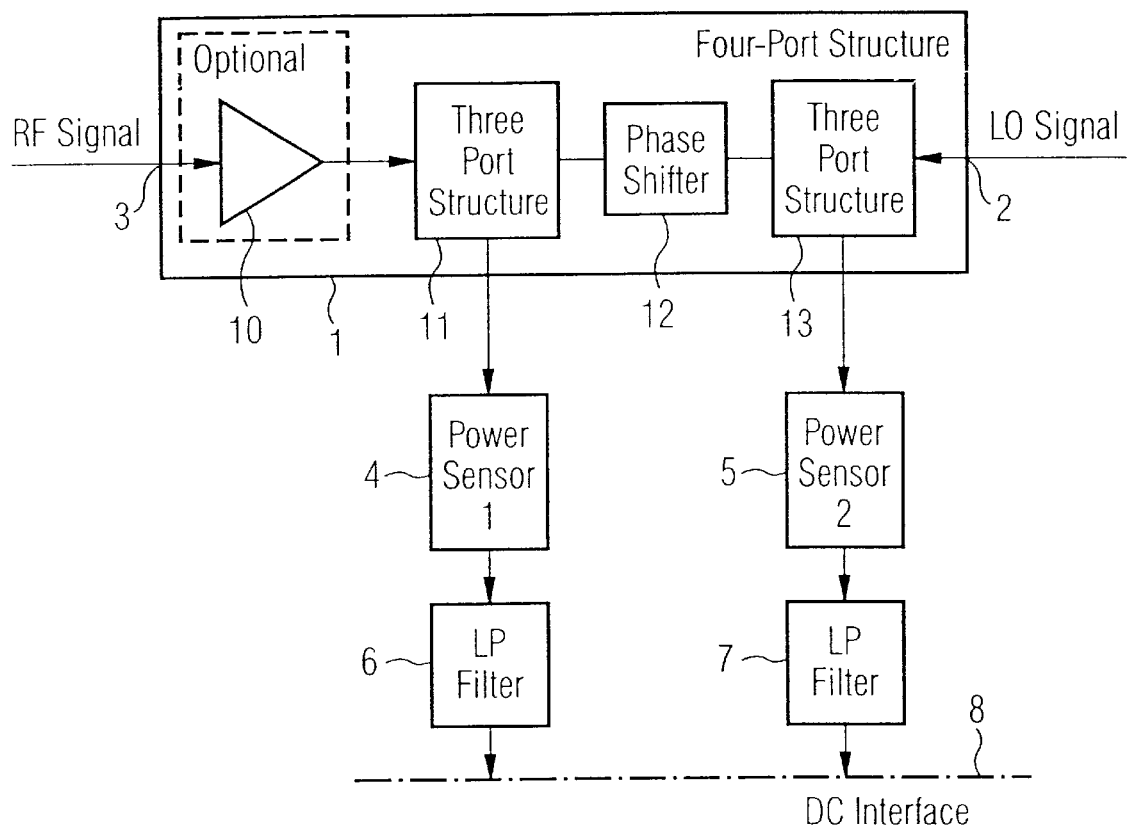
FIG. 3 shows further details of an embodiment of a four port structure according to the present invention.

FIG. 3 shows a further embodiment for the internal structure of a four port structure 1 according to the present invention. According to this embodiment the four port structure 1 comprises the first three port structure 11 connected to a second three port structure 13 by means of a phase shifter 12. Between the RF signal input 3 and the three port structure 11 an amplifier 10 can be provided, wherein the amplifier 10 also provides for an RF/LO isolation function. The amplifier 10 represents an active device with isolation functionality. It should be noted that the amplifier 10 needs to have a good match at the input only and a well matched output is not required. Different implementation technologies are possible for the circuit elements as shown in FIG. 3 wherein the shown circuitry can be integrated by using a MMIC approach.

FIGS. 4A and 4B two possible implementation (realisation) options for a four port demodulator, wherein resistive components are used. Regarding further details of the internal structure and the realisation options for the four port demodulator reference is made to the already cited post published PCT/EP 98/08329.

Figure 5:
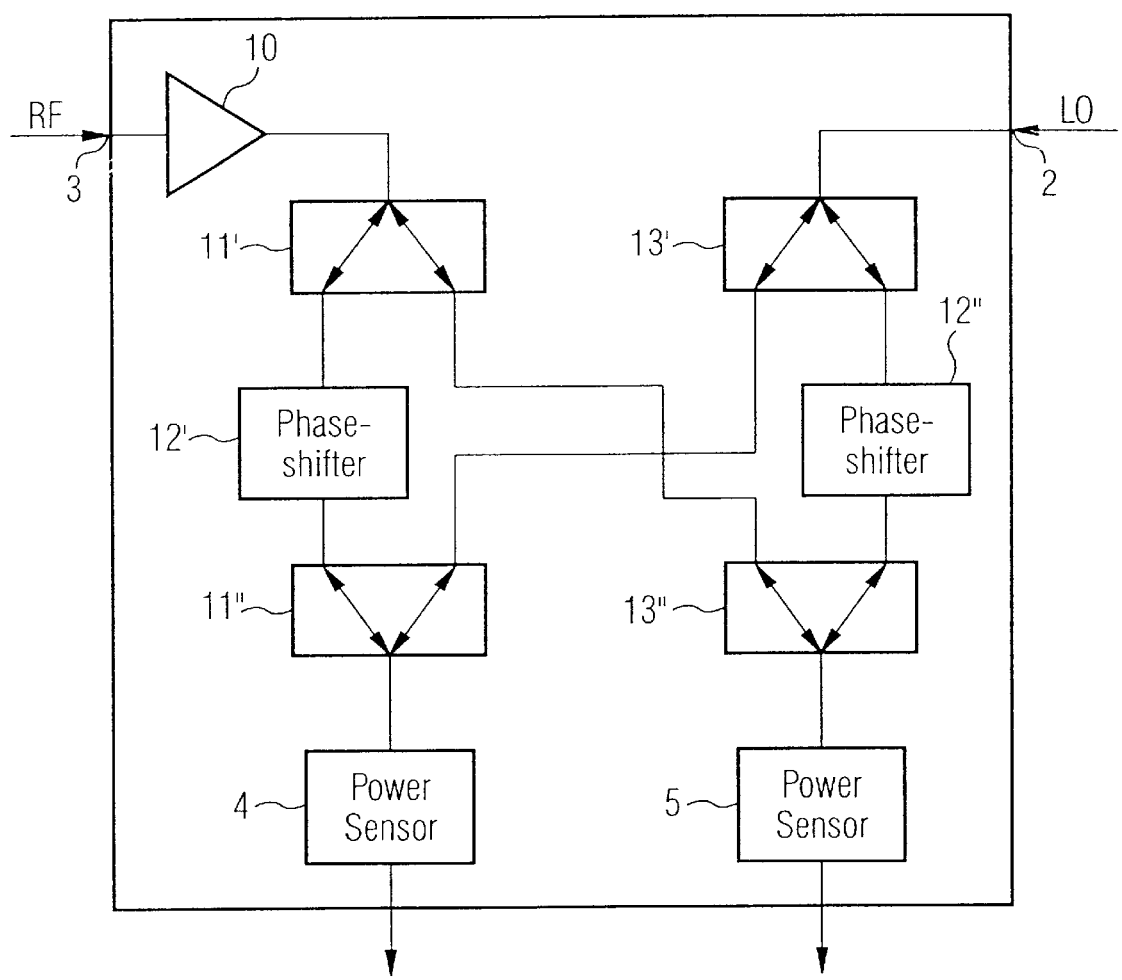
FIG. 5 shows an functional description of a four port structure.

FIG. 5 is a functional bloc diagram of a four port demodulator. The RF signal from the first input 3 is passed through the amplifier 10 and then supplied to a passive three port as—acting as a power splitter (RF power divider). The three port 11' is connected to another three port 11" by means of a first phase shifter 12'. The three port 11' is furthermore connected with another three port 13'. On the other hand the three port structure 11" is connected to a still another three port structure 13' which is supplied by the local oscillator signal and which is connected by a second phase shifter 12" with the three port structure 13".

The three port structures 11" and 13" are respectively connected to a power sensor 4 and 5 which can be implemented by diodes. The RF power levels at both power sensors 4, 5 are the same which has some advantages in some cases.

Figure 6:
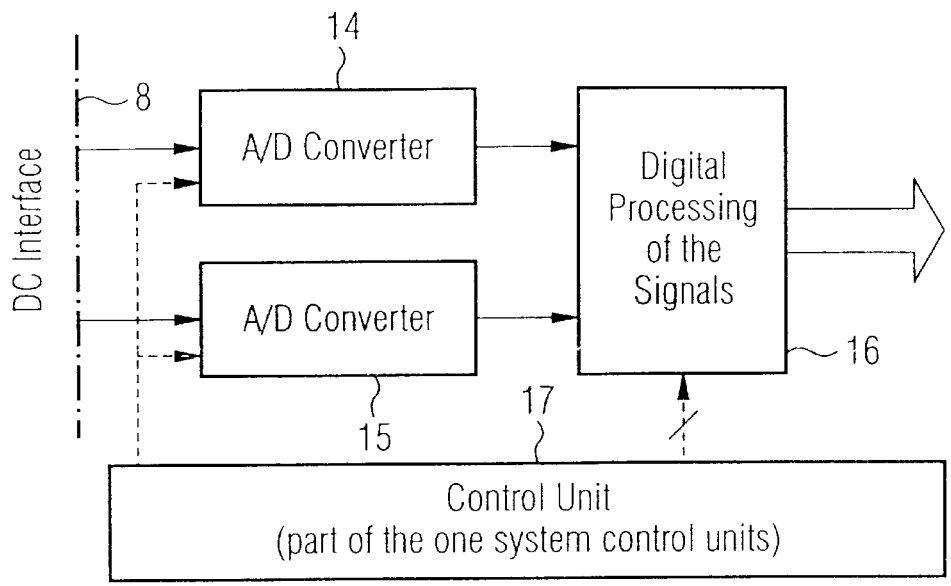
FIG. 6 shows the further processing of the output signals of the power sensors and the low pass filters of FIG. 1.

In FIG. 6 a first embodiment for the circuit following the DC Interface 8 is presented. The two DC signals output by the low pass filters 6, 7 (see FIG. 1) are converted by means of A/D converter 14, 15 and then set to a digital processing unit 16. The output signals of the digital processing unit 16 are demodulated bits. The A/D converter 14, 15 as well as the digital processing unit 16 can be controlled by a control unit 17 which is part of the one system control units.

Figure 7:
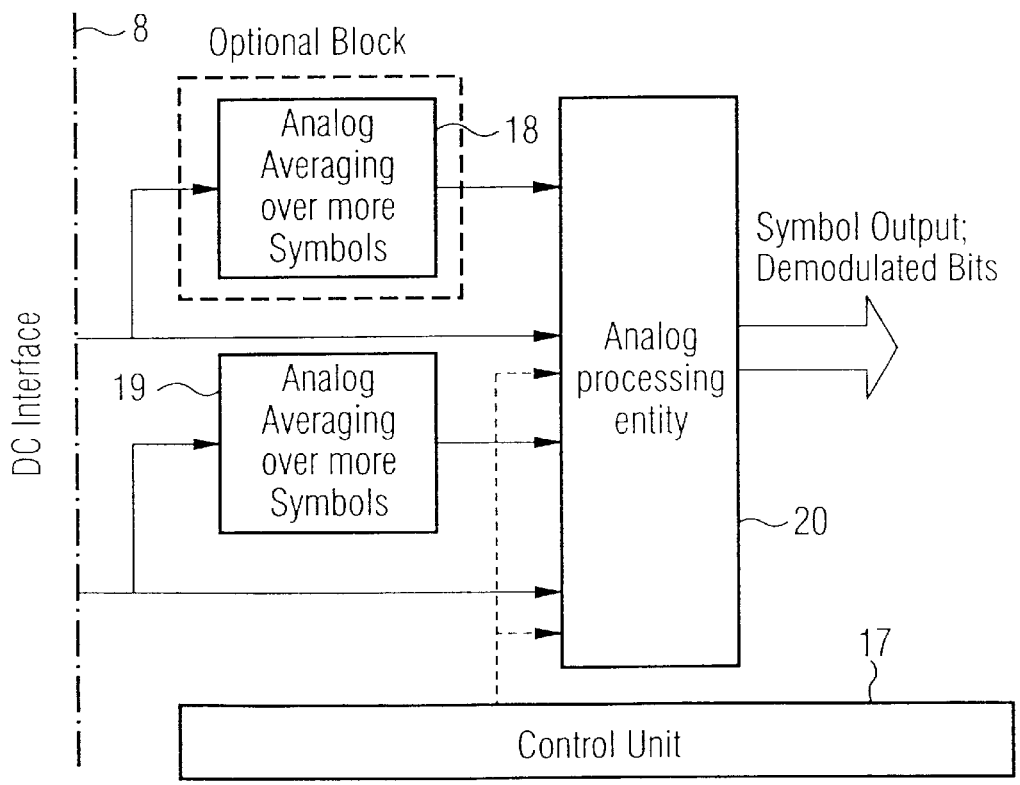
FIG. 7 shows an alternative embodiment to the circuitry shown in FIG. 6, FIG. 8 and FIG. 9 show simulation results.

FIG. 7 shows a further embodiment for the circuitry following the DC Interface 8. Each of the output signals of the low pass filter 6, 7 (see FIG. 1) is supplied to an analog processing end unit 20. Furthermore the output signals of the low pass filter 6, 7 are supplied to an analog averaging unit 18 and 19, respectively. The analog averaging unit affect an averaging process on the DC signal supplied and output a signal to be supplied to the analog processing unit 20. Again the analog processing unit 2 can be controlled by control unit 17 for setting the demodulation deepness. To summarise, according to the embodiment of FIG. 7 an analog averaging of at least one of the output signals of the low pass filter 6, 7 is performed. The average DC signal is then provided together with the associated DC signal to the analog processing unit 20. The output of the analog processing unit 20 can be directly demodulated bits.

Alternatively, the analog processing unit 20 of FIG. 7 can be followed by an A/D converting unit (with a small number of bits) in order to provide "quasi" two soft bits for further accurate processing.

The mathematical background shows the basics of the applied approach and determines the method of operation of the proposed structure. The mathematical background is described taking into account the simplest case Mathematical Background Two RF signals are provided at the demodulator inputs.

$$v_1 = \rho V_0 e^{i\phi} \tag{1}$$

$$v_2 = V_0 \tag{2}$$

The second signal is related to the LO, and it is considered as a phasor with constant magnitude and constant phase.

$$v = \frac{v_1}{v_2} = \rho e^{j\phi} \quad I = \rho\cos\varphi \quad Q = \rho\sin\varphi \tag{3}$$

$$s = \begin{bmatrix} 0 & 0 & s_{13} & s_{14} \\ 0 & 0 & s_{23} & s_{24} \\ s_{31} & s_{32} & 0 & 0 \\ s_{41} & s_{42} & 0 & 0 \end{bmatrix} = \begin{bmatrix} 0 & 0 & s_{13} & s_{14} \\ 0 & 0 & s_{23} & s_{24} \\ k_{31}e^{j\theta_{31}} & k_{32}e^{j\theta_{32}} & 0 & 0 \\ k_{41}e^{j\theta_{41}} & k_{42}e^{j\theta_{42}} & 0 & 0 \end{bmatrix} \tag{4}$$

Equation 4 determines the ideal S matrix of the 4-port structure, with the ideal matching of power sensors and amplifier.

$$v_3 = s_{31}v_1 + s_{32}v_2 = k_{31}e^{j\theta_{31}}\rho e^{j\theta}v_2 + k_{32}e^{j\theta_{32}}v_2 \tag{5}$$

$$V_4 = s_{41}v_1 + s_{42}v_2 = k_{41}e^{j\theta_{41}}\rho e^{j\theta}v_2 + k_{42}e^{j\theta_{42}}v_2 \tag{6}$$

$$v_3 = (k_{31}\rho e^{j(\theta_{11}-\theta_{12}-\phi)} + k_{32})v_2 e^{j\theta_{11}} \tag{7}$$

$$v_4 = (k_{41}\rho e^{j(\theta_4-\theta+\phi)} = k_{42})v_2 e^{j\theta_{12}} \tag{8}$$

$$P_3 = P_2)k_{31}^2\rho_2 + k_{32}^2 - 2k_{31}k_{32}\rho\cos)\,\theta_{31}-\theta_{32}+\phi)) \tag{9}$$

$$P_4 = P_2)k_{41}^2\rho_2 + k_{42}^2 - 2k_{41}k_{47}\rho\cos)\theta_{41}-\theta_{42}+\phi)) \tag{10}$$

$$\Delta\theta_3 = \theta_{31} - \theta_{32} \Delta\theta_4 = \theta_{41} - \theta_{42} \tag{11}$$

$$P_3 = \frac{1}{N}\sum_1^N P_3 \tag{12}$$

Equation 12 shows the calculation of the average magnitude at one of the power sensors, averaged over more symbols.

$$\overline{p} = \frac{1}{k_{31}}\sqrt{\frac{\overline{P_3}}{\overline{P_2}} - k_{32}^2} \quad (13)$$

Using the averaging information, the average power of the incoming RF signal may be calculated by equation (13). This is related to the power of the LO, and parameters of the four port circuitry, which are considered as known.

Auxiliary variables are introduced, which are related to the trigonometric functions, and, therefore, they have to satisfy the relation (17).

$$CX_3 = \cos(\Delta\theta_3 + \phi) = \cos\Delta\theta_3 \cos\phi - \sin\Delta\theta_3 \sin\phi \quad (14)$$

$$CX_4 = \cos(\Delta\theta + \phi) = \cos\Delta\theta_4 \cos\phi - \sin\Delta\theta_4 \sin\phi \quad (15)$$

$$CI = \cos\phi; CQ = \sin\phi \quad (16)$$

$$|CX_3 CX_4 CICQ| \leq 1 \quad (17)$$

According to equations (9) and (10), the same variables may be also presented according to the following equations, where the magnitude states ρ of the modulated signal are figuring.

$$CX_3 = \frac{1}{2k_{31}k_{32}\rho}\left(\frac{P_3}{P_2} - k_{32}^2 - k_{31}^2\rho^2\right) \quad (18)$$

$$CX_4 = \frac{1}{2k_{41}k_{32}\rho}\left(\frac{P_4}{P_2} - k_{42}^2 - k_{41}^2\rho^2\right) \quad (19)$$

$$CI = \frac{CX_3 \sin\Delta\theta_4 - CX_4 \sin\Delta\theta_3}{\sin(\Delta\theta_4 - \Delta\theta_3)} \quad (20)$$

$$CQ = \frac{CX_3 \cos\Delta\theta_4 - CX_4 \cos\Delta\theta_3}{\sin(\Delta\theta_4 - \Delta\theta_3)} \quad (21)$$

$$\Delta\theta_3 \neq k\frac{\pi}{2}, \Delta\theta_4 \neq k\frac{\pi}{2}, \Delta\theta_4 - \Delta\theta_3 \neq k\pi \quad (22)$$

$$I = \rho \cdot CI \quad (23)$$

$$Q = \rho \cdot CQ \quad (24)$$

According to the trigonometric relations, equation (25)

$$CI^2 + CQ^2 = 1 \quad (25)$$

has to be fulfilled.

That means: if we have guessed the right magnitude states in the equation (18)–(21) equation (25) is (in ideal case) fulfilled.

That results, that the guess was right, so that related calculated phase is correct and modulation states is demodulated in the proper way.

Thus, we have the following operation procedure:
1. Detecting the average power of the incoming RF signal
2. Using information about RF signal power and knowing the modulation scheme with a finite number of the modulation states, we are able to calculate the actual values of the possible magnitudes
3. Using all of the possible magnitudes (usually available in the memory, because the average signal strength does not change very fast), a set of values CI and CQ are calculated
4. Set of error functions (26) is obtained
5. Those values which are leading to the minimum error functions are the right values, so that demodulation information is performed $$\text{Err} = \min|CI_2 + CQ_2 - 1| \quad (26)$$

In the following equations the possible values for two examples: 16QAM and 64QAM, are provided.

$$16QAM \text{ case: } \rho_{1,2,3} = \overline{\rho}\sqrt{\frac{[1\ 5\ 9]}{5}} \quad (27)$$

$$64QAM \text{ case: } \rho_{1,2,3,4,5,6,7,8,9} = \quad (28)$$

$$\overline{\rho}\sqrt{\frac{[2\ 10\ 18\ 26\ 34\ 50\ 58\ 74\ 98]}{42}}$$

TABLE I

Legend of Variables

| | |
|---|---|
| $v_1$ | RF signal to be I/Q demodulated |
| $v_2$ | Second RF signal (known) |
| ρ | magnitude ratio between RF signal one and two, which may have finite number of the possible states |
| φ | phase difference between RF signal one and two |
| S | S matrix of the ideal four port junction, where active entity has gain of 1 |
| $k_{mn}$ | magnitude of the complex transfer function from port n to m |
| $\theta_{mn}$ | phase of the complex transfer function from port n to m |
| $v_3$ | signal which approaches power sensor 1 |
| $v_4$ | signal which approaches power sensor 2 |
| $P_3$ | Power level detected at power sensor 1 |
| $P_4$ | Power level detected at power sensor 2 |
| $\overline{P_3}$ | Averaged Power level detected at power sensor 1 after N signals |
| $\overline{\rho}$ | Averaged magnitude ratio between RF signal one and two |
| $CX_3$ | Help variable related to Power $P_3$ |
| $CX_4$ | Help variable related to Power $P_4$ |
| CI | Normalised I value |
| CQ | Normalised Q value |
| Err | Error Function |

Note that the same procedure may be applied for also other modulations schemes where the finite number of magnitude modulation states exists, like in DAPSK.

It should be denoted that when nQAM type of modulation is targeted, where N is larger than 16, the number of calculation effort may be reduced, by applying specific algorithmic changes.

Verification of the proposed solution by simulation

Figure 4:
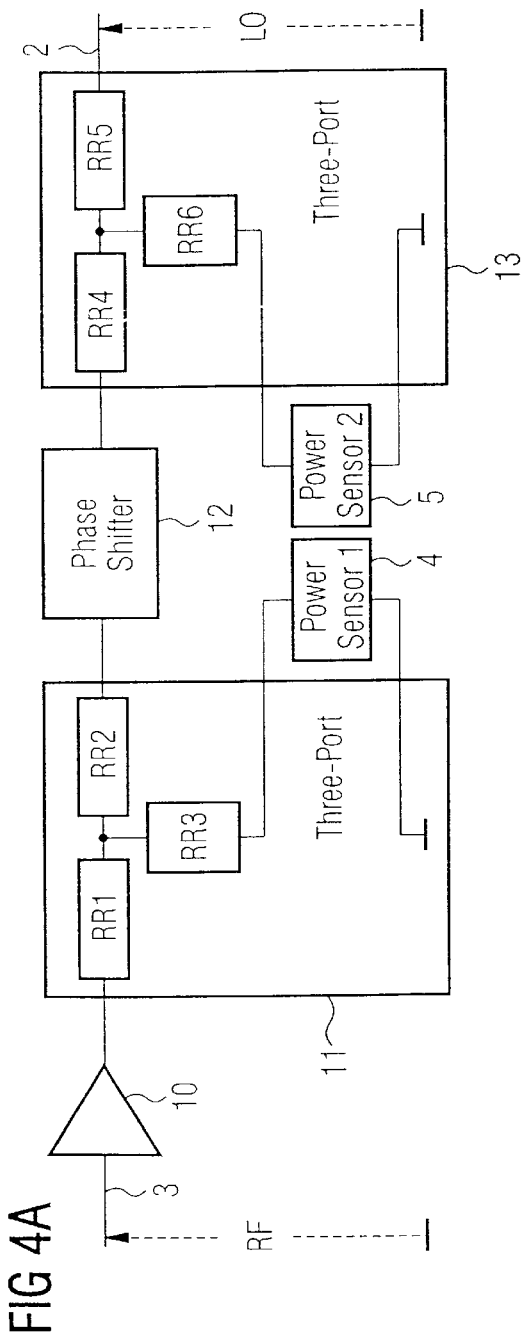
FIGS. 4A and 4B show an implementation of the present invention by means of phase shifter and resistive elements.

Verification of the concept is done according to the four port structure of FIG. 4, where:

resistive three port structures are assumed, the input amplifier has a gain of one, ideal matching deal linear power sensors are assumed.

In the first phase 16 QAM signal are considered, without any noise, where the LO power level is the same as RF power level. In that case we have the following values for possible magnitude states: $\rho_1 = 0.4472$, $\rho_2 = 1.0000$ and $\rho_3 = 1.3416$.

In that case we may have the following table:

TABLE II

| Original Signal without Noise | Error Function $CI^2 + CQ^2 - 1$ ($\rho_1$) | Error Function $CI^2 + CQ^2 - 1$ ($\rho_2$) | Error Function $CI^2 + CQ^2 - 1$ ($\rho_3$) |
|---|---|---|---|
| −1.0000 − 1.0000i | 16.2336 | 0.9432 | 0.0000 |
| −1.0000 − 0.3333i | 2.0335 | 0.0000 | 0.5297 |
| −1.0000 + 0.3333i | 0.6498 | 0.0000 | 0.8278 |
| −1.0000 + 1.0000i | 0.1339 | 0.6666 | 0.0000 |
| −0.3333 − 1.0000i | 9.1888 | 0.0000 | 0.2655 |

TABLE II-continued

| Original Signal without Noise | Error Function $CI^2 + CQ^2 - 1\ (\rho_1)$ | Error Function $CI^2 + CQ^2 - 1\ (\rho_2)$ | Error Function $CI^2 + CQ^2 - 1\ (\rho_3)$ |
|---|---|---|---|
| −0.3333 − 0.3333i | 0.0000 | 0.0588 | 0.8210 |
| −0.3333 + 0.3333i | 0.0000 | 0.5955 | 1.4174 |
| −0.3333 + 1.0000i | 1.1389 | 0.0000 | 0.6289 |
| 0.3333 − 1.0000i | 13.6608 | 0.0000 | 0.7623 |
| 0.3333 − 0.3333i | 0.0000 | 0.8355 | 0.1728 |
| 0.3333 + 0.3333i | 0.0000 | 0.2989 | 0.4235 |
| 0.3333 + 1.0000i | 5.6108 | 0.0000 | 0.1320 |
| 1.0000 − 1.0000i | 43.0664 | 3.6265 | 0.0000 |
| 1.0000 − 0.3333i | 15.4502 | 0.0000 | 0.9611 |
| 1.0000 + 0.3333i | 12.7669 | 0.0000 | 0.6630 |
| 1.0000 + 1.0000i | 26.9666 | 2.0167 | 0.0000 |

It may be observed that the correct values ar at the places where the error function takes zero value.

In the Table III, one 16 QAM signal is analyzed in the case when the N/N ratio is 18 dB, LO power is 10 dB larger than RF signal and phase of the noise (worst case) takes uniformly all of the values. It can be ofserved that the minimum function requirement (eq. 26) is sufficient for the proper detection of the signal. Simulations are perfomed for the case of resistive tolerances of 10% (FIG. 4).

TABLE III

| Original Signal with S/N = 15dB | Error Function $CI^2 + CQ^2 - 1\ (\rho_1)$ | Error Function $CI^2 + CQ^2 - 1\ (\rho_2)$ | Error Function $CI^2 + CQ^2 - 1\ (\rho_3)$ |
|---|---|---|---|
| 1.1691 + 1.0550i | 14.7131 | 1.6424 | 0.2690 |
| 1.1439 + 1.1045i | 14.7936 | 1.6745 | 0.2957 |
| 1.1045 + 1.1439i | 14.4676 | 1.6362 | 0.2894 |
| 1.0550 + 1.1691i | 13.7873 | 1.5352 | 0.2528 |
| 1.0000 + 1.1778i | 12.8442 | 1.3865 | 0.1923 |
| 0.9450 + 1.1691i | 11.7508 | 1.2086 | 0.1161 |
| 0.8955 + 1.1439i | 10.6213 | 1.0204 | 0.0325 |
| 0.8561 + 1.1045i | 9.5585 | 0.8388 | 0.0513 |
| 0.8309 + 1.0550i | 8.6459 | 0.6773 | 0.1292 |
| 0.8222 + 1.0000i | 7.9480 | 0.5469 | 0.1966 |
| 0.8309 + 0.9450i | 7.5130 | 0.4564 | 0.2489 |
| 0.8561 + 0.8955i | 7.3761 | 0.4130 | 0.2818 |
| 0.8955 + 0.8561i | 7.5588 | 0.4227 | 0.2914 |
| 0.9450 + 0.8309i | 8.0635 | 0.4885 | 0.2743 |
| 1.0000 + 0.8222i | 8.8657 | 0.6090 | 0.2295 |
| 1.0550 + 0.8309i | 9.9069 | 0.7765 | 0.1591 |
| 1.1045 + 0.8561i | 11.0927 | 0.9760 | 0.0693 |
| 1.1439 + 0.8955i | 12.2989 | 1.1863 | 0.0304 |
| 1.1691 + 0.9450i | 13.3871 | 1.3829 | 0.1279 |
| 1.1778 + 1.0000i | 14.2259 | 1.5414 | 0.2109 |

Figure 8:
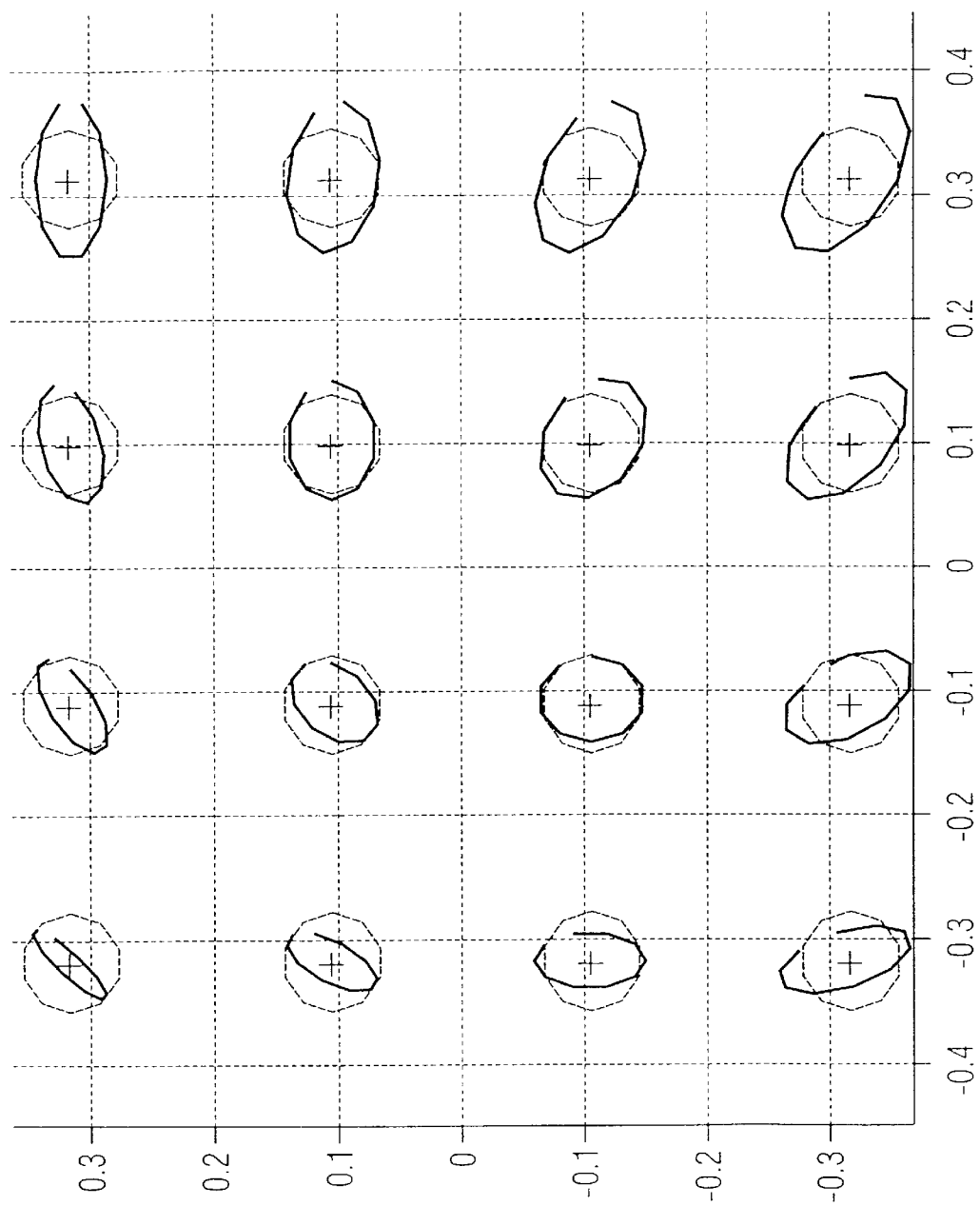
Figure 9:
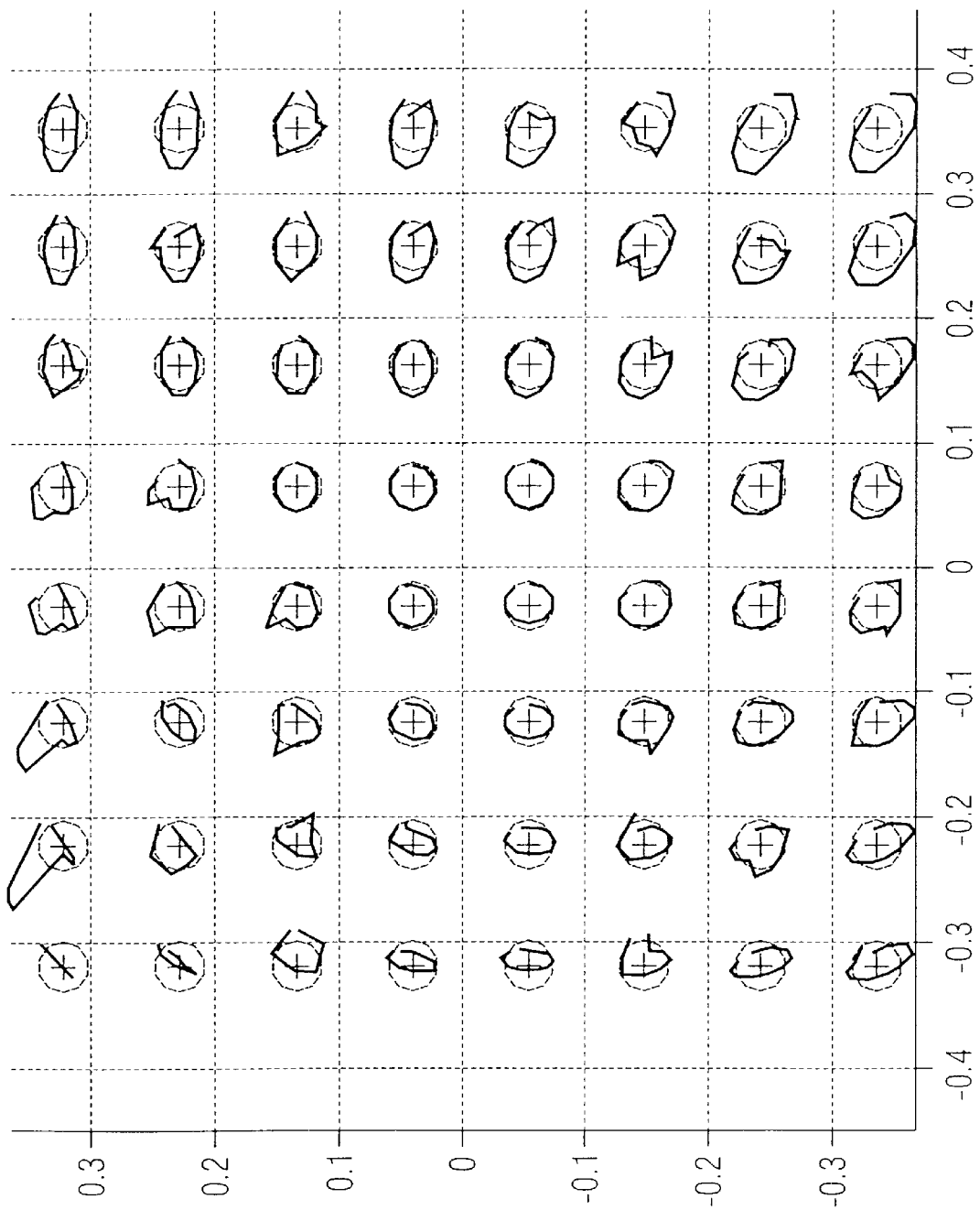
Figure 10:
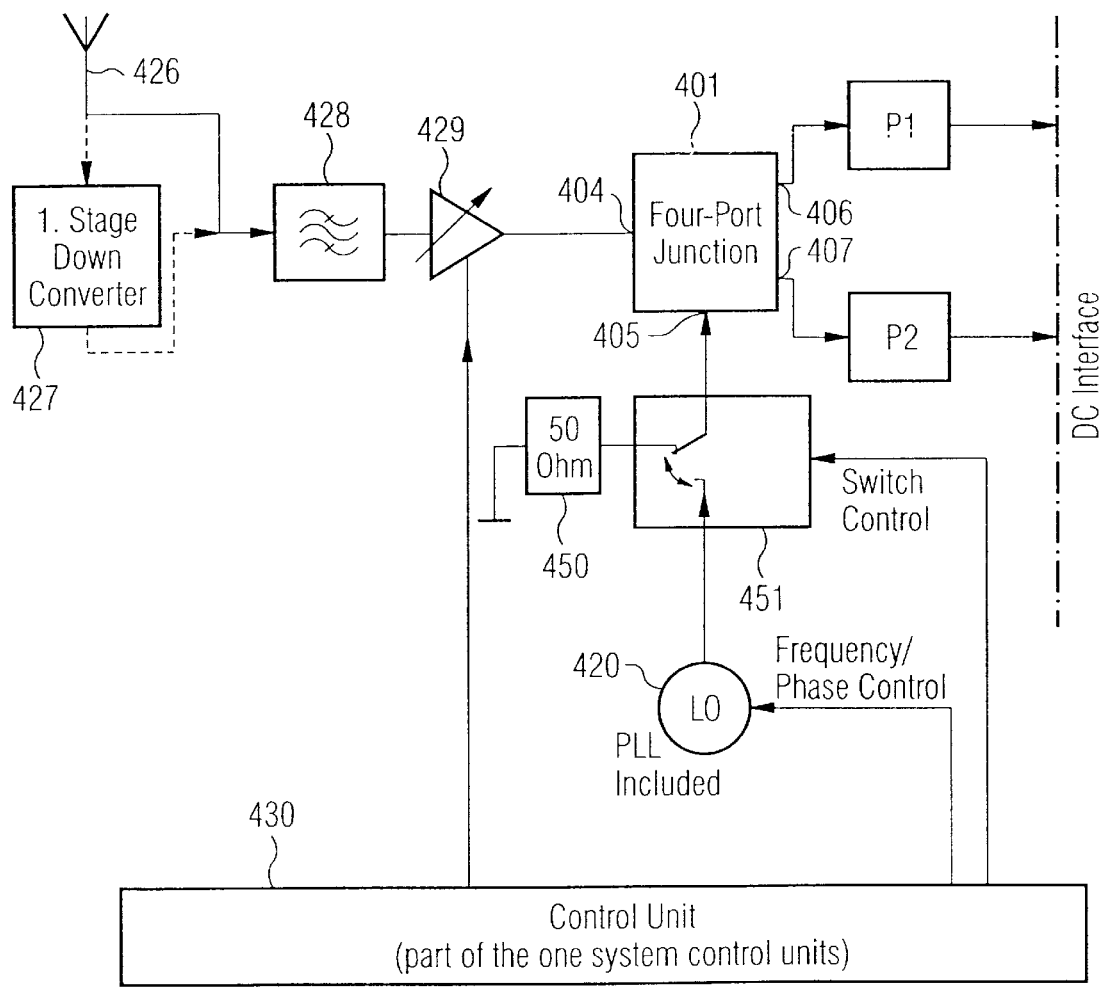
FIG. 10 shows a four port junction based receiver according to post published prior art.
Figure 11:
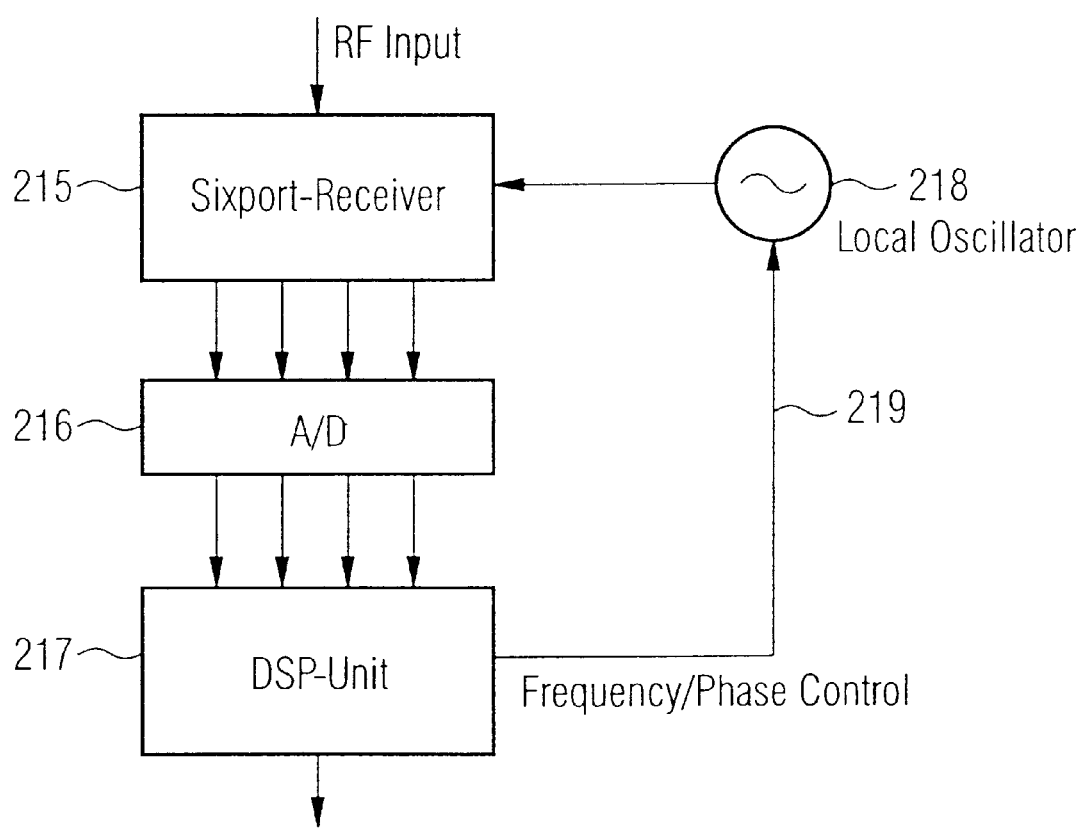
FIG. 11 shows a coherent N-port receiver known from PCT/EP 98/08329.

In the FIG. 8 an example for 16 QAM signal is presented. In FIG. 9 an example for 64 QAM is shown.

What is claimed is:

1. A demodulator for modulated RF signals comprising a passive four port structure having:
    a first input for supplying a modulated RF signal to be demodulated,
    a second input for supplying a RF signal from a local oscillator, and
    two output terminals respectively connected to a power sensor, wherein the RF signal from the local oscillator is supplied to the second input of the four port structure without being switched by a RF switch; and
    wherein the four port structure comprises two three port structures connected to each other by means of a phase shifter.

2. The demodulator according to claim 1, characterized in that an isolation circuitry is connected to the first input of the passive four port structure for providing isolation between RF and LO.

3. The demodulator according to claim 1, characterized in that the RF signal from the local oscillator is directly supplied to the second input of the four port structure.

4. The demodulator according to claim 1, characterized in that the four port structure is implemented by resistive elements.

5. The demodulator according to claim 1, characterized in that a low pass filter is attached to the output of each power sensor.

6. The demodulator according to claim 5, characterized in that the output of the low pass filter is supplied to an A/D converter and then to a digital processing unit.

7. The demodulator according to claim 5, characterized in that the least one of the output signals of the low pass filter is supplied to an analog averaging unit averaging a plurality of symbols and the output of the analog averaging unit is supplied to an analog processing unit together with the output of the low pass filter.

8. The demodulator according to claim 1, characterized in that the RF signal to be demodulated is modulated according to a modulation scheme with a finite number of magnitude states.

9. A mobile communications device, characterized in that it comprises the demodulator according to claim 1.

10. A method for demodulating modulated RF signals, the method comprising the following steps:
    supplying a modulated RF signal to be demodulated to a first input of a passive four port structure,
    supplying a RF signal from a local oscillator to a second input of the passive four port structure and
    supplying two outputs of the four port structure to power sensors, wherein the RF signal from the local oscillator is supplied to the second input of the four port structure without RF switching; and
    wherein the four port structure comprises two three port structures connected to each other by means of a phase shifter.

11. The method according to claim 10, characterized in that the RF signal from the local oscillator is directly supplied to the second input of the four port structure.

12. The method according to claim 10, characterized in that the first input is isolated from the second input of the four port structure for providing isolation between RF and LO.

13. The method according to claim 10, further comprising the step of low pass filtering the output of the power sensors.

14. The method according to claim 13, characterized in that the output of the low pass filtering step is A/D converted and then digitally processed.

15. The method according to claim 13, characterized in that at least one output of the low pass filtering step is averaged in an analog manner over a plurality of symbols to generate an averaged signal that is analog processed together with the output of the low pass filtering step.

16. The method according to claim 10, characterized in that the RF signal to be demodulated is modulated according to a modulation scheme with a finite number of magnitude states.

* * * * *